(12) United States Patent
Stuenkel et al.

(10) Patent No.: US 11,139,847 B2
(45) Date of Patent: Oct. 5, 2021

(54) SELF-TUNING N-PATH FILTER

(71) Applicant: BAE Systems Information and Electronic Systems Integration Inc., Nashua, NH (US)

(72) Inventors: Mark E. Stuenkel, Goffstown, NH (US); Mark D. Hickle, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/738,475

(22) Filed: Jan. 9, 2020

(65) Prior Publication Data

US 2021/0218429 A1 Jul. 15, 2021

(51) Int. Cl.
| | |
|---|---|
| H04B 1/10 | (2006.01) |
| H03H 11/04 | (2006.01) |
| H04K 3/00 | (2006.01) |
| H04L 27/00 | (2006.01) |
| H03L 7/081 | (2006.01) |

(52) U.S. Cl.
CPC .......... *H04B 1/1081* (2013.01); *H03H 11/04* (2013.01); *H03L 7/0812* (2013.01); *H04K 3/42* (2013.01); *H04L 27/0002* (2013.01)

(58) Field of Classification Search
CPC .......... H04B 15/06; H04B 1/10; H04B 15/00; H04B 2215/067; H04B 15/04; H04B 1/006; H04B 1/525; H04B 1/005; H04B 1/123; H04B 1/1027; H04B 15/02; H04B 1/1018

USPC ................................ 375/349, 316, 219, 295
See application file for complete search history.

(56) References Cited

U.S. PATENT DOCUMENTS

| | | | |
|---|---|---|---|
| 6,791,995 B1* | 9/2004 | Azenkot ................ | H04B 1/707 348/E5.008 |
| 7,295,826 B1 | 11/2007 | Cook et al. | |
| 2006/0280231 A1 | 12/2006 | Sorrells et al. | |
| 2011/0300885 A1* | 12/2011 | Darabi .................... | H04B 1/52 455/500 |
| 2012/0243643 A1 | 9/2012 | Sorrells et al. | |
| 2013/0028302 A1 | 1/2013 | Rofougaran et al. | |
| 2013/0178179 A1 | 7/2013 | Han et al. | |

(Continued)

OTHER PUBLICATIONS

Galal, Sherif, and Razavi, Behzad, "10-GB/s Limiting Amplifier and Laser/Modulator Driver in 0.18-µ CMOS Technology," IEEE Journal of Solid-State Circuits, vol. 38, No. 12, Dec. 2003. pp. 2138-2146.

(Continued)

*Primary Examiner* — Zewdu A Kassa
(74) *Attorney, Agent, or Firm* — Finch & Maloney PLLC; Scott J. Asmus

(57) ABSTRACT

A radio frequency (RF) filter includes a signal conditioning circuit and a bandstop filter. The signal conditioning circuit receives a broadband RF signal that includes both a jamming signal at a jamming frequency and a signal of interest and generates a plurality of clock signals. Each of the plurality of clock signals has a substantially same frequency as the jamming frequency, but a different phase shift. The bandstop filter receives the RF signal and the plurality of clock signals. The bandstop filter attenuates signals within a bandstop centered at the frequency of the plurality of clock signals. A self-tuning N-path filter is provided.

20 Claims, 8 Drawing Sheets

(56) References Cited

U.S. PATENT DOCUMENTS

2014/0171006 A1\* 6/2014 Murphy ................ H04B 15/06
455/296
2019/0157015 A1 5/2019 Nguyen et al.

OTHER PUBLICATIONS

Ghaffari, et al., "Tunable N-Path Notch Filters for Blocker Suppression: Modeling and Verification," IEEE Journal of Solid-State Circuits, vol. 48, No. 6, Jun. 2003 pp. 1370-1382.
Gillette, et al., "Ferrite-Based Reflective-Type Frequency Selective Limiters," IEEE MTT-S International Microwave Workshop Series on Advanced Materials and Processes for RF and THz Applications (IMWS-AMP 2018), Jul. 16-18, 2018. 3 pages.
Naglich, Eric J. and Guyette, Andrew C., "Frequency-Selective Limiters Utilizing Contiguous-Channel Double Multiplexer Topology," IEEE Transactions on Microwave Theory and Techniques, vol. 64, No. 9, Sep. 2016. pp. 2871-2882.
W. Yang, M. Abu Khater, E. J. Naglich, D. Psychogiou and D. Peroulis, "Frequency-Selective Limiters Using Triple-Mode Filters," IEEE Access, vol. 8, p. 114854-114863, 2020.
E. J. Naglich, S. Shin and S. Albright, "Autonomously-Switchable Bandstop Filters with Integrated Sensor and Driver Circuitry," IEEE IMS 2018, pp. 394-396, 2018.
International Search Report, PCT/US2021/012443, dated Mar. 30, 2021, 7 pages.

\* cited by examiner

SELF-TUNING N-PATH FILTER

BACKGROUND

Receivers with wide tuning ranges are desirable for various applications, including radar warning systems, surveillance systems, identification friend-or-foe (IFF) systems, and general radio frequency (RF) communication systems. Because such receivers are designed to collect a broad range of high frequency bandwidth, they are susceptible to jamming signals. For example, jamming signals or other undesired high-powered signals at any frequency within the wide frequency bandwidth can cause debilitating problems for RF front end circuitry since such signals can saturate amplifiers and impair the ability of the receiver to recover signals of interest at surrounding frequencies. For this reason, it is important to identify and attenuate jamming signals. However, doing so without attenuating signals of interest at the surrounding frequencies can be very challenging.

BRIEF DESCRIPTION OF THE DRAWINGS

Features and advantages of embodiments of the claimed subject matter will become apparent as the following Detailed Description proceeds, and upon reference to the Drawings, in which:

Figure 1A:
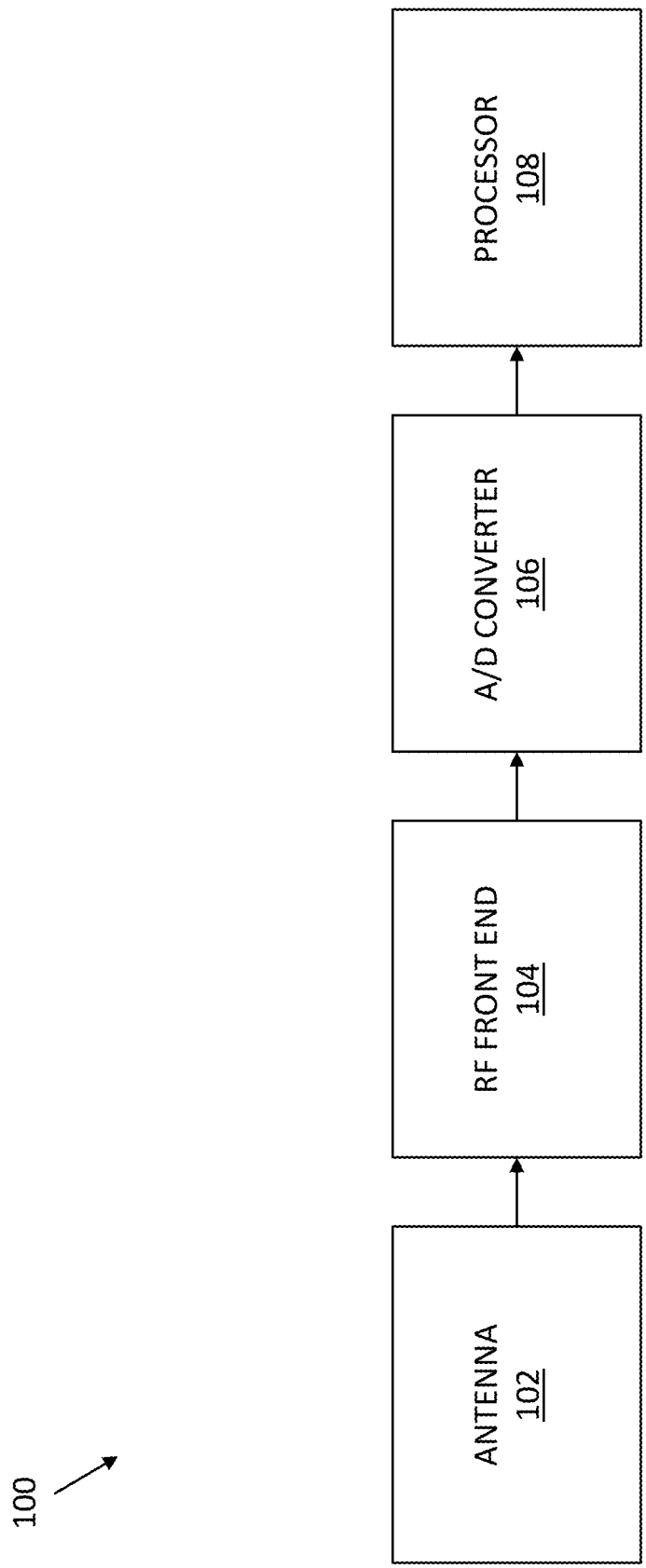
FIG. 1A illustrates a block diagram of an RF receiver system, in accordance with an embodiment of the present disclosure.

Although the following Detailed Description will proceed with reference being made to illustrative embodiments, many alternatives, modifications, and variations thereof will be apparent in light of this disclosure.

DETAILED DESCRIPTION

A self-tuning N-path filter is disclosed. The filter is particularly well-suited for wideband receiver applications, but other filter applications will be apparent. In an embodiment, the filter includes a signal conditioning circuit and an N-path bandstop filter. The signal conditioning circuit generates a set of multiphase clock signals at the same frequency as the strongest incident signal, and the N-path filter provides a bandstop transfer function centered at the frequency of the multiphase clock signals. As will be explained in turn, deriving a multiphase clock signal from the actual signals incident on the filter allows the filter to automatically tune its center frequency to the frequency of the highest-power incident signal. The filter system can be made relatively compact (e.g., within a single chip package or chip set), has relatively low latency, and is configurable with respect to both bandwidth and power activation threshold, according to some such embodiments. Numerous embodiments and variations will be appreciated in light of this disclosure.

General Overview

Wideband RF receivers are useful tools for listening across a large frequency bandwidth for various types of signals and are especially important in situations where the frequency of interest may not be known beforehand. Example situations include electronic warfare or surveillance where signals of interest can be intercepted and decoded, and in some cases, scrambled or altered to confuse the or otherwise impair intended receiver. However, and as noted above, wideband receivers are susceptible to jamming and other high-powered undesired signals, due to the necessary absence of RF preselect filtering. As such, identifying and attenuating such undesired signals can be quite difficult without also attenuating signals of interest at the surrounding frequencies. For instance, merely employing power-dependent RF limiters can certainly attenuate jamming signals, but also has the undesired effect of attenuating desired signals at other frequencies. One possible improvement to such an RF limiter approach is a frequency-selective limiter (FSL), which selectively attenuates high-power jamming signals while passing low-powered signals at other frequencies with no attenuation. FSLs have been demonstrated using ferrite materials and PIN diodes. However, such FSLs typically are physically large (e.g., greater than 50 square inches or otherwise much larger than chip scale) and/or have slow response times (e.g., several microseconds or worse).

Thus, and according to an embodiment of the present disclosure, a self-tuning power-activated N-path bandstop filter is disclosed which implements frequency-selective limiter (FSL) behavior. The filter acts as an all-pass filter for low-power signals, passing them with little attenuation. For jamming signals above a prescribed power threshold, the filter autonomously implements a bandstop transfer function centered on the jammer's frequency. The center frequency of the bandstop transfer function is derived from the actual signals incident on the filter. Thus, it is possible for the filter to automatically tune its center frequency to the frequency of the highest-power incident signal. So, the filter attenuates the jammer signal while passing signals at other frequencies with little attenuation. The filter can be implemented as an integrated circuit using, for example, complementary metal oxide semiconductor (CMOS) processes, thereby allowing for a very compact design (e.g., chip-scale, such as less than 50 or even 10 millimeters squared). In addition, the filter provides fast response times (e.g., less than 50 nanoseconds), and reconfigurability of both bandwidth and power activation threshold, according to some embodiments.

In one specific embodiment, the self-tuning power-activated N-path bandstop filter is included in a wideband receiver. The filter includes a signal conditioning circuit and a bandstop filter. The signal conditioning circuit receives broadband RF signal incident upon an antenna of the receiver. Further assume the received broadband RF signal includes a jamming signal at a jamming frequency. The filter circuit generates a plurality of clock signals. Each of the plurality of clock signals has a frequency that is substantially the same as the jamming frequency, but a different phase shift. The bandstop filter receives the RF signal and the plurality of clock signals. The bandstop filter attenuates the jamming signal centered at the frequency of the plurality of clock signals. Embodiments of the wideband receiver described herein can be made smaller (e.g., within a single chip package), have lower latency than prior solutions, and are more configurable than prior solutions. For example, both the amplitude threshold and the stopband bandwidth can be configurable as will be discussed in more detail herein. Numerous variations and alternative embodiments will be appreciated in light of this disclosure.

RF Receiver Overview

FIG. 1A illustrates an example RF receiver (or transceiver) 100, according to an embodiment. As can be seen, RF receiver 100 includes an antenna 102, RF front end circuitry 104, an analog-to-digital converter (ADC) 106, and a processor 108. In some cases, RF receiver 100 is integrated into a system-on-chip, or a chip set, that is populated on a printed circuit board (PCB) which may in turn be populated into a chassis of a multi-chassis system or an otherwise higher-level system, although any number of implementations can be used. In a more general sense, RF receiver 100 may be one portion of an electronic device, or a standalone receiver device. In any such case, RF receiver 100 is configured to receive a broad range of RF signals. In some embodiments, RF receiver 100 may also be configured to transmit RF signals.

Antenna 102 may be implemented with any antenna configuration suitable for capturing a broad range of frequencies, but in some example embodiments includes one or more patch antennas or microstrip antennas. Any number of antennas or antenna elements may be included in antenna 102. In some embodiments, antenna 102 may include one or more antennas to support multiple communication bands (e.g., dual band operation or tri-band operation). For example, some of the antennas may support tri-band operation within the frequency range of 3 gigahertz to 300 gigahertz, such as antennas that support tri-band operation at 20 gigahertz to 30 gigahertz, 40 gigahertz to 45 gigahertz, and 55 gigahertz to 75 gigahertz, although any number of frequency ranges can be used as will be appreciated. Various ones of the antennas may support, for example, 5G communications or other standards-based communications (e.g., 2.4, 28, 39, and 60 gigahertz communications). Various ones of the antennas may support millimeter wave communications. Various ones of the antennas may support high band frequencies and low band frequencies. In a more general sense, antenna 102 may be any number of antenna types and configurations suitable for receiving (and possibly transmitting) desired communication signals, as will be appreciated.

RF front end circuitry 104 includes various components that are designed to filter and amplify selected portions of a received RF signal, according to an embodiment. RF front end circuitry 104 may be designed to have a high dynamic range that can tune across a wide bandwidth of frequencies. For example, RF front end circuitry 104 may include components that are capable of tuning to particular frequency ranges within a signal having a bandwidth in the gigahertz range, such as bandwidths between 5 GHz and 50 GHz, or between 10 GHz and 20 GHz, or any other frequency range of interest. In some embodiments, RF front end circuitry 104 includes one or more integrated circuit (IC) chips packaged together in a system-on-chip (SOC) or system-in-package (SIP) configuration. Any number of standard or proprietary RF receiver configurations can be used. In any such cases, and according to some embodiments of the present disclosure, RF front end circuitry 104 includes a portion that is designed to detect and attenuate jamming signals or other types of unwanted high-amplitude signals using an N-path filter 110, as will be discussed in turn with reference to FIG. 1B.

Figure 1B:
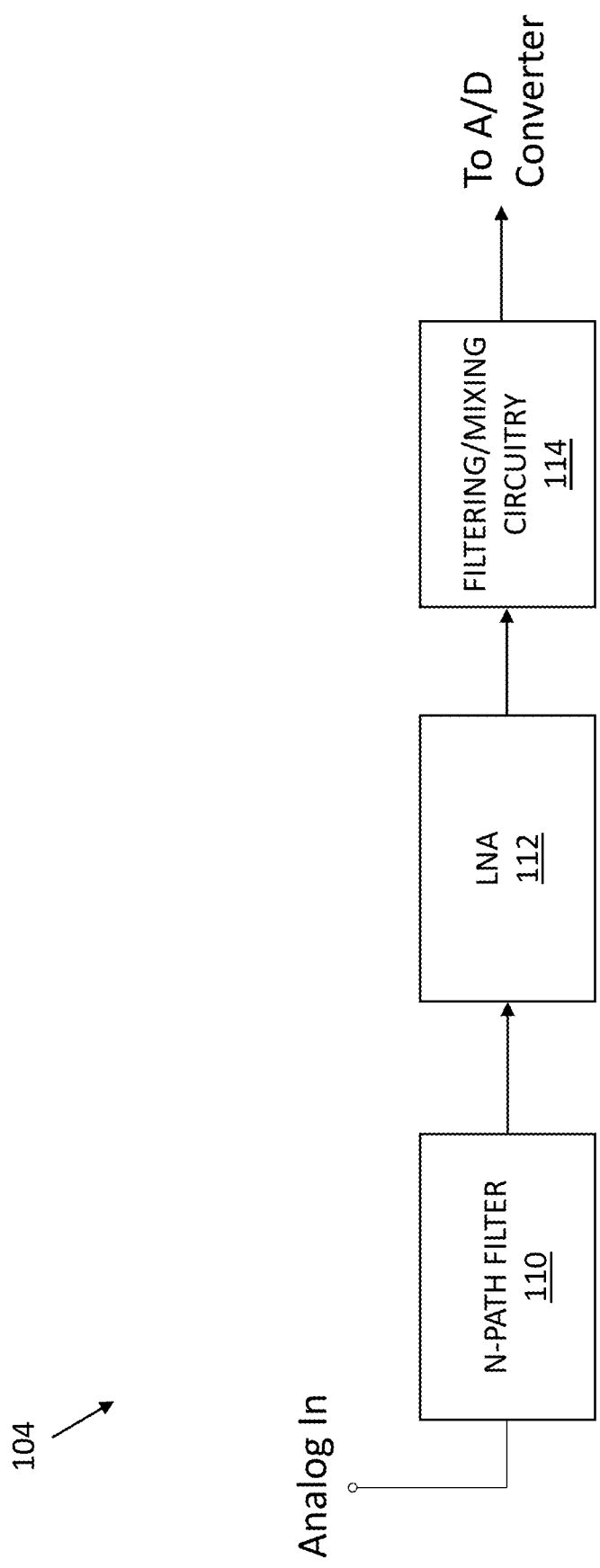
FIG. 1B illustrates a block diagram of example RF front end circuitry, in accordance with an embodiment of the present disclosure.

FIG. 1B illustrates various components of example RF front end circuitry 104, according to an embodiment. As can be seen, RF front end circuitry 104 includes an N-path filter 110 designed to receive analog signal input, either directly or indirectly, from antenna 102 and attenuate large-amplitude signals (e.g., jamming signals). Further details regarding the structures used to perform the detection and attenuation of jamming signals are provided herein with reference to FIGS. 2-7. Other filters may also be provided to keep out or otherwise limit the amplitude of certain noise frequencies or other extraneous signals. Such other filters may be bandpass, bandstop, highpass, and/or lowpass filters depending upon factors such as the signals of interest, the desired signal-to-noise ratio (SNR), and the noise environment.

Once such jamming signals have been attenuated or removed at block 110, the analog signal may be amplified at an LNA block 112, which may include any number of low-noise amplifying circuits. In a more general sense, any suitable amplification circuitry can be used, as will be appreciated. Depending on the application, various portions of the analog signal may be selected, and in some cases further amplified, using filtering/mixing circuitry 114. Filtering/mixing circuitry 114 can include any number of mixers, filters, and buffers to select a desired portion of the analog signal. Mixers are typically used to change the frequencies of the received signals and uses a local oscillator (LO) signal with the mixer to output a signal that is RF+/−LO. The mixing may cause down-conversion or up-conversion of the analog signal. In some cases, it is desirable to process the lower frequency signals. LNA 112 and filtering/mixing circuitry 114 may employ standard or proprietary RF conditioning techniques as will be appreciated. In some embodiments, N-path filter 110, LNA block 112, and filtering/mixing circuitry 114 are arranged in a different order and/or may have a different degree of integration than that shown in FIG. 1B. For instance, LNA 112 may be integrated into or be located after some portion of filtering/mixing circuitry 114. In a more general sense, the illustrated circuitry can be position in any order within RF front end circuitry 104 that is suitable for a given application or filtering purpose.

ADC 106 may be implemented with any standard or proprietary analog-to-digital conversion technology, and is generally configured to receive a filtered, amplified RF signal from RF front end circuitry and to convert the signal into a digital signal for further processing. In some example embodiments, ADC 106 has a linear range of between about 6 GHz and about 10 GHz, and the output resolution is in the range of 6 to 12 bits, although the present disclosure is not intended to be limited to such specific implementation details.

Processor 108 may be configured to receive the digitized signal generated by ADC 106 and perform any number of operations on or otherwise with the signal. For example, processor 108 may look for particular patterns or signatures in the received digital signal. As used herein, the term "processor" may refer to any device or portion of a device that processes electronic data from registers and/or memory to transform that electronic data into other electronic data that may be stored in registers and/or memory, and/or to make determinations and/or decisions based on that electronic data. Processor 108 may include one or more digital signal processors (DSPs), application-specific integrated circuits (ASICs), field programmable gate arrays (FPGAs), central processing units (CPUs), graphics processing units (GPUs), cryptoprocessors (specialized processors that execute cryptographic algorithms within hardware), server processors, custom-built semiconductor, or any other suitable processing devices. In a more general sense, any processing entity suitable for a given receiver application can be used.

Figure 2:
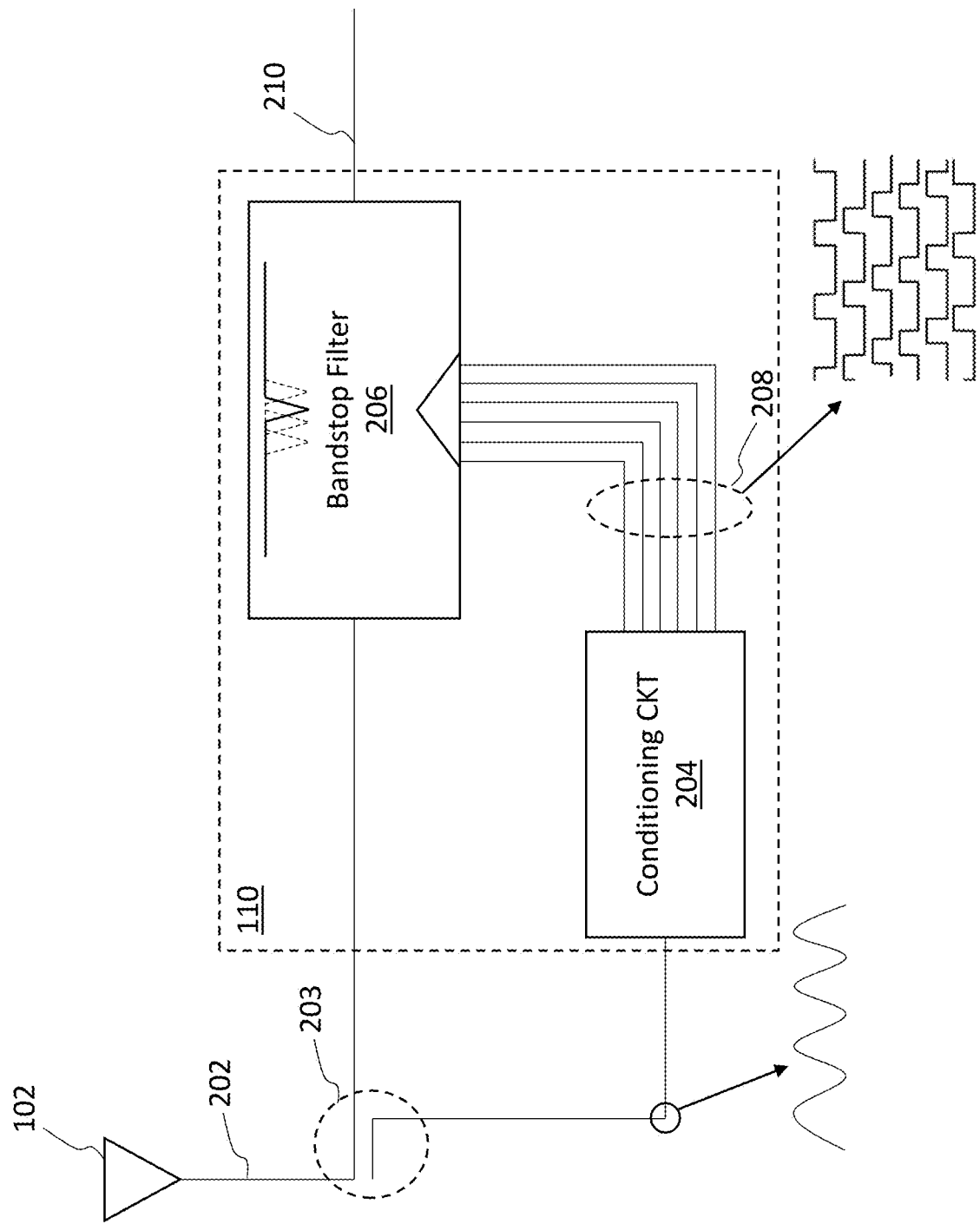
FIG. 2 illustrates a schematic diagram of a self-tuning N-path filter that can be used, for example, in the RF front end of the receiver system of FIG. 1, in accordance with an embodiment of the present disclosure.

FIG. 2 illustrates a schematic diagram of a self-tuning N-path filter 110 that can be used, for example, in the RF front end of the receiver system of FIG. 1, in accordance with an embodiment of the present disclosure. As can be seen, filter 110 includes a conditioning circuit 204 and a band-rejection or bandstop filter 206. In operation, filter 110 is an example of a frequency selective limiter (FSL). In particular, filter 110 acts essentially as an all-pass or high-pass filter when weak signals are present but acts as a bandstop when strong signals (e.g., jamming signals) are present to attenuate or filter the high-power signals in the narrow frequency band such as those used in jamming. Note that in some embodiments the filter 110 acts as a high-pass filter (rather than an all-pass filter) for low-amplitude signals, wherein lower frequency signals (e.g., those below 100 MHz) are attenuated, which would not interfere with the reception of RF signals in the GHz range.

As can be further seen in in the example embodiment of FIG. 2, an input RF signal 202 is received from antenna 102 and a percentage of that signal is coupled or otherwise routed via a coupler 203 (e.g., a 10 dB or 20 dB coupler) to conditioning circuit 204 and bandstop filter 206. Input RF signal 202 may include, for example, one or more signals of interest, as well as at least one jamming signal that is to be attenuated using bandstop filter 206. An output RF signal 210 is generated by bandstop filter 206, which effectively includes input RF signal 202 having its jamming signal substantially attenuated. This signal 210 in one example continues through the RF front end processing for amplification and down-conversion or up-conversion. Note that other signals (possibly including signals of interest) that are close in frequency to the jamming signal may also be attenuated to some degree, but not as much as the undesired jamming signal. Such attenuation of other signals may vary from one embodiment to the next depending on factors such as the sharpness of the filter corners and steepness of roll off (e.g., number of filter poles, etc.), and can be considered negligible so long as those other signals can still be received and understood by the receiver or other application.

Conditioning circuit 204 receives a coupled percentage or other representation of input signal 202 and is configured to produce a plurality of clock signals 208 that drive the operation of bandstop filter 206, according to an embodiment. For example, conditioning circuit 204 includes a limiting amplifier that effectively identifies the frequency at which a jamming signal is located, and further includes a delay-locked loop (DLL) circuit to generate a plurality of square wave clock signals having substantially the same frequency as the jamming signal frequency. Due to the nature of the DLL, each of the plurality of clock signals is out of phase with the other clock signals by a same amount that depends on the number of clock signals present. For example, conditioning circuit 204 may be designed to generate 3, 4, 6, or 8 different clock signals. If three clock signals are generated, then the phase difference between the four clock signals is 120° (360°/3). If four clock signals are generated, then the phase difference between the three clock signals is 90° (360°/4). Similarly, if eight clock signals are generated, then the phase difference between the eight clock signals is 45° (360°/8), and so on. Additionally, the duty cycle of each of clock signals 208 is changed based on the number of clock cycles. For example, for three clock signals, the duty cycle of each of clock signals 208 is reduced to 33% (⅓). For four clock signals, the duty cycle of each of clock signals 208 is reduced to 25% (¼). Similarly, for eight clock signals, the duty cycle of each of clock signals 208 is reduced to 12.5% (⅛), and so on.

In order to implement power-dependent functionality, conditioning circuit 204 may further include an envelope detector circuit with a programmable threshold (or comparable circuitry). In one such embodiment, the envelope detector circuit can be used to activate the DLL clock generation circuitry only when a prescribed input power level is reached, according to some embodiments. In some such embodiments, for instance, conditioning circuit 204 includes a standard threshold detection circuit to determine if a signal exists within the overall input RF signal 202 with a high enough amplitude to require being attenuated by bandstop filter 206. The amplitude threshold of the threshold detection circuit may be adjusted, for instance, manually by a user, or automatically via software or switchable circuitry. Such configurability can be used, for example, to change the sensitivity of RF front end circuitry 104 towards potentially harmful jamming signals, according to some embodiments.

According to some embodiments, bandstop filter 206 is an N-path bandstop filter where the center frequency of the stopband is automatically centered at the frequency of the multiphase clock signals 208 being received from conditioning circuit 204. Since the frequency of the multiphase clock signals 208 is determined by conditioning circuit 204 to be substantially the same frequency as a jamming signal, bandstop filter 206 is designed to self-tune its stopband (also called a rejection band or notch) based on input from the conditioning circuit 204, and to attenuate the jamming signal while maintaining the integrity of the other frequencies within input RF signal 202 outside of the stopband. As used herein, having a stopband centered at a frequency that is substantially the same as the jamming frequency means that the jamming frequency falls at least within a −3 dB bandwidth region of the stopband of filter 206. For many applications, this translates to the frequency of the multiphase clock signals 208 being within, for example, about 0.5-5 MHz of the jamming frequency. The width of the stopband may be, for example, about 1 MHz to 10 MHz, according to some embodiments. Further note that the frequency of the jamming signal to be attenuated need not be perfectly centered in the stopband. Thus, there may be a degree of asymmetry with respect to where the jamming signal is located within the stopband (e.g., the center frequency of the jamming signal may be located closer to one corner frequency of the stopband than the other corner frequency of the stopband). Of course, symmetry may be achieved as well.

In some embodiments, bandstop filter 206 includes a plurality of switched paths (N switched paths) each coupled to a capacitor. By switching between different paths based on the multiphase clock signals 208, a highly selective stopband is created to attenuate a specific signal of interest (e.g., the jamming signal). The stopband width may be set depending on the size of the capacitors used. However, the stopband width may also be adjustable by using, for example, variable capacitors or by switching between different capacitor banks having different sized capacitors.

These adjustments of the stopband width may be made manually by a user, or automatically via software or a programmable processor or logic.

The output RF signal 210 includes a form of input RF signal 202 having attenuated jamming signals. The attenuated jamming signals are less likely to saturate downstream amplifiers or cause other problems. If no jamming signals are present within input RF signal 202, then input RF signal 202 would either pass through bandstop filter 206 without alteration or be diverted around bandstop filter 206. In some embodiments, if no jamming signals are present within input RF signal 202 (e.g., no clock signals are supplied to bandstop filter 206), bandstop filter 206 acts as a high-pass filter with a low cutoff frequency, passing signals at relevant RF frequencies with minimal attenuation.

Figure 3:
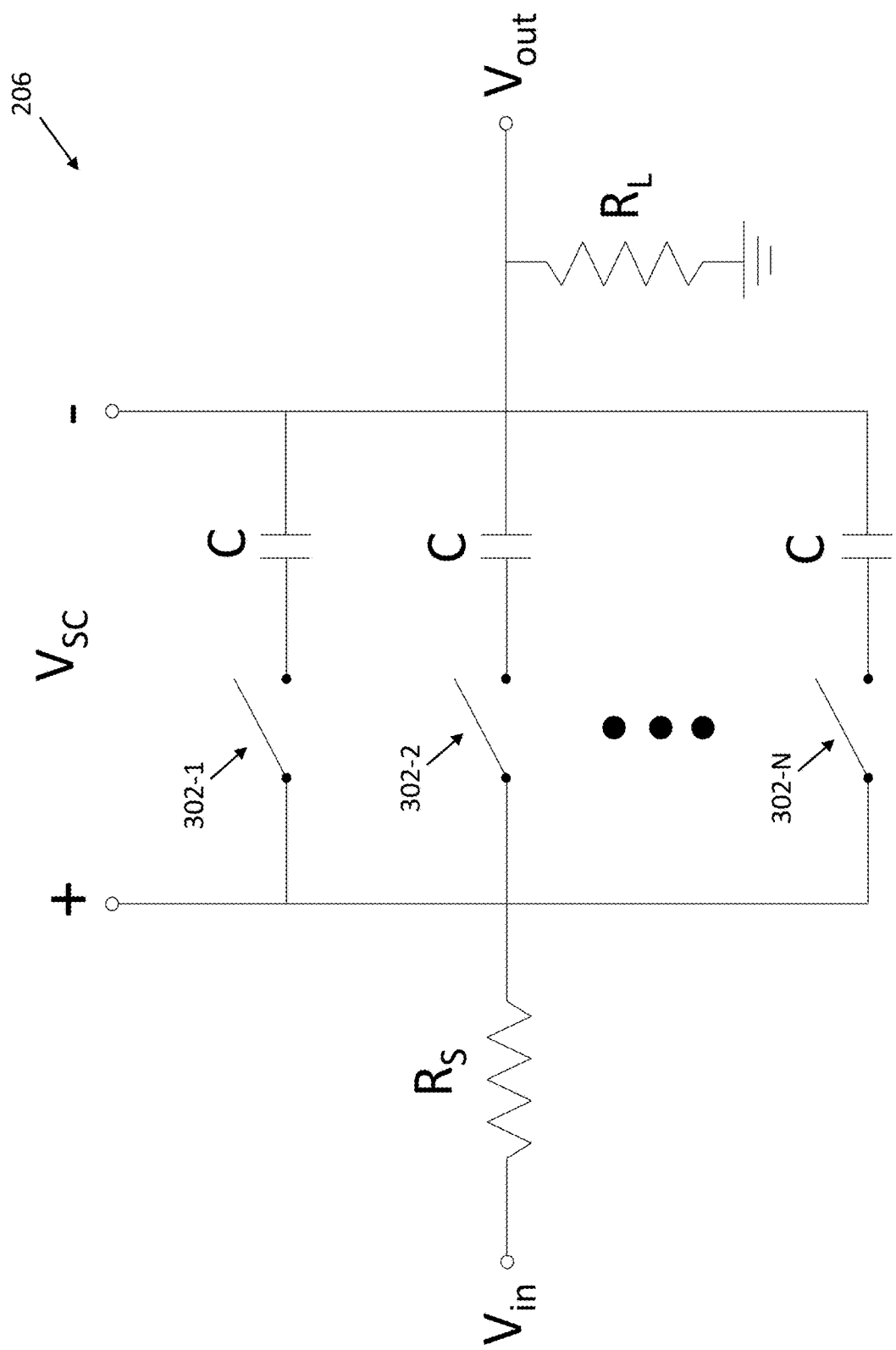
FIG. 3 illustrates a schematic diagram of an N-path bandstop filter that can be used in the self-tuning N-path filter of FIG. 2, according to an embodiment.

FIG. 3 illustrates an example circuit diagram for at least a portion of bandstop filter 206, according to an embodiment. The input RF signal ($V_{in}$) is diverted down one or more of a series of N paths based on the state of respective switches 302-1-302-N. In some such embodiments, each path includes one switch, although other embodiments may include any number of switches on any of the N paths. Each of the N paths includes one or more capacitors (C) that may have the same capacitance on each path, although other embodiments may have different capacitance on different paths (so long as the various amounts of switchable capacitance is suitable for a given application).

The switching frequency for switches 302-1-302-N is based on the received plurality of clock signals 208. In some embodiments, each switch 302-1-302-N corresponds to one of the plurality of clock signals 208 and is closed in phase with the corresponding clock signal. The output voltage ($V_{out}$) is provided as $(R_L/(R_L+R_S)) (V_{in}-V_{SC})$. The switched capacitor part (represented by $V_{SC}$) in combination with the source and load resistors act as a high impedance element for the switching frequency while presenting a low impedance for frequencies away from the switching frequency (e.g., outside of the stopband). As noted above, capacitors (C) may be variable capacitors in order to adjust the size of the stopband. In some other embodiments, different banks having differently sized capacitors may be switched between for each path to select a stopband size.

Figure 4:
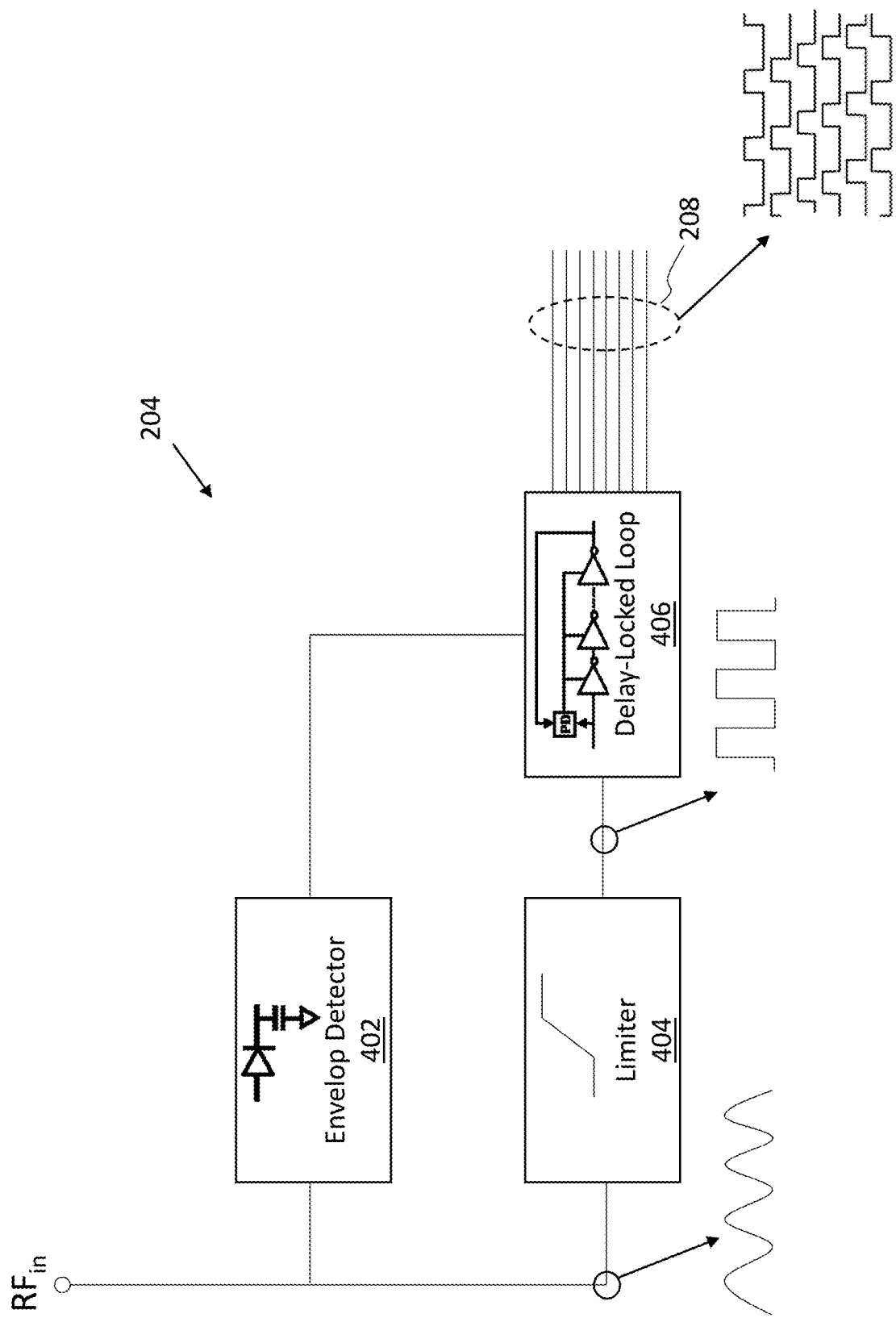
FIG. 4 illustrates a schematic diagram of a conditioning circuit that can be used in the self-tuning N-path filter of FIG. 2, in accordance with an embodiment of the present disclosure.

FIG. 4 illustrates a more detailed schematic of conditioning circuit 204, according to an embodiment. As can be seen in this example case, conditioning circuit 204 includes an envelope detector 402, a voltage limiter circuit 404, and a delay-locked loop 406 with edge combining circuitry. In some embodiments, the edge combining circuitry is separate from the delay-locked loop 406. Other circuits may be included as well including various amplifiers, filters, or other types of signal conditioning circuits. Likewise, other comparable circuits that provide similar functionality can be used instead of the specific example circuits shown, as will be appreciated.

As can be further seen, a representation of input RF signal ($RF_{in}$) is received by envelope detector 402, which monitors $RF_{in}$ and determines if an amplitude of any portion of $RF_{in}$ exceeds a threshold. The threshold may be configurable by a user or set based on certain characteristics of $RF_{in}$. Any portions of $RF_{in}$ that exceed the amplitude threshold may represent jamming signals that need to be removed. Accordingly, if the threshold is crossed, envelope detector 402 transmits an activation signal to activate delay-locked loop 406, which in turn generates clock signals having a same frequency as the frequency of $RF_{in}$ with the threshold-crossing amplitude, based on input from limiter circuit 404. In some embodiments, envelope detector 402 includes one or more diodes and frequency filtering components (such as any number of capacitors or inductors) arranged to produce a direct current (DC) output voltage proportional to the signal amplitude across the bandwidth of $RF_{in}$. In a more general sense, envelop detector 402 can be implemented as a standard envelope detector.

According to some embodiments, $RF_{in}$ is also received by a limiter circuit 404 that isolates the frequency having the highest amplitude (e.g., a jamming frequency) within $RF_{in}$ and produces a square wave output having the same frequency, or substantially the same frequency, as the highest amplitude frequency. In this context, "substantially the same frequency" can be a frequency that differs from the jamming frequency by a negligible amount with regards to the filtering process (e.g., differing by less than 100 MHz). The square wave output is fed to delay-locked loop 406 where multiple clock signals of different phase (but the same frequency) are produced. In some embodiments, limiter circuit 404 includes an amplifier with high gain to purposefully saturate the amplifier and produce a square wave output having the same frequency as the most dominant (e.g., highest amplitude) signal from the input signal. If a jamming signal is present, its amplitude would be much higher than the desired RF signals and thus the amplifier would produce a square wave signal having a frequency closely matched to the jamming signal frequency. In some embodiments, a single high-gain amplifier stage is used as a limiting amplifier, while in some other embodiments several amplifier stages are cascaded together to form the limiting amplifier. In a more general sense, limiter circuit 404 can be implemented as a standard voltage limiter.

According to some embodiments, the square wave output from limiter circuit 404 is delayed multiple times to produce a plurality of phase shifted clock signals using delay locked loop 406. Delay locked loop 406 may include a delay line of cascaded inverter circuits (or other similar delay gates) coupled to a phase comparator circuit in a negative feedback loop to maintain the phase offset from each stage. Briefly, the phase comparator circuit detects the phase difference between the input to the delay line and the output form the end of the delay line and produces a control voltage proportional to the phase error to adjust the delay of each of the stages of the delay line. The result is a plurality of clock signals having the same frequency as the input square wave signal but offset in phase by a set amount. According to some embodiments, delay-locked loop produces 3, 4, 6, or 8 phase-shifted clock signals. It should be understood, however, that any number of phase-shifted clock signals can be produced. In some embodiments, a phase locked loop (PLL) is used in place of delay locked loop 406. In a more general sense, circuit 406 can be implemented as a standard DLL or PLL.

According to some embodiments, the plurality of clock signals generated from delay-locked loop 406 are received by edge combining circuitry (either included in the DLL 406 or as a discrete circuit) where the duty cycle of each of the clock signals is reduced to produce the final plurality of clock signals 208. According to some such embodiments, the edge combining circuitry includes one or more AND gates where each of the plurality of clock signals is provided to the input of an AND gate while another square wave signal having the same frequency, but different phase is provided to the other input of the AND gate. The result is clock signal having a reduced duty cycle based on the phase difference between the input signals. The reduction in the duty cycle depends on the number of different clock signals produced by delay-locked loop 406. The duty cycle of each of the plurality of clock signals is set by edge combining circuit 408 to 1/(# of clock signals), such that 3 clock signals results in a 33% duty cycle, 4 clock signals results in a 25% duty cycle, and 8 clock signals results in a 12.5% duty cycle, to name a few examples. According to some embodiments, the lowered duty cycle makes the clock signals compatible with the timing needed for operating the switches of bandstop filter 206. In some specific example embodiments, DLL 406 is implemented as a standard DLL with edge combining, although other comparable circuits can be used.

Figure 5:
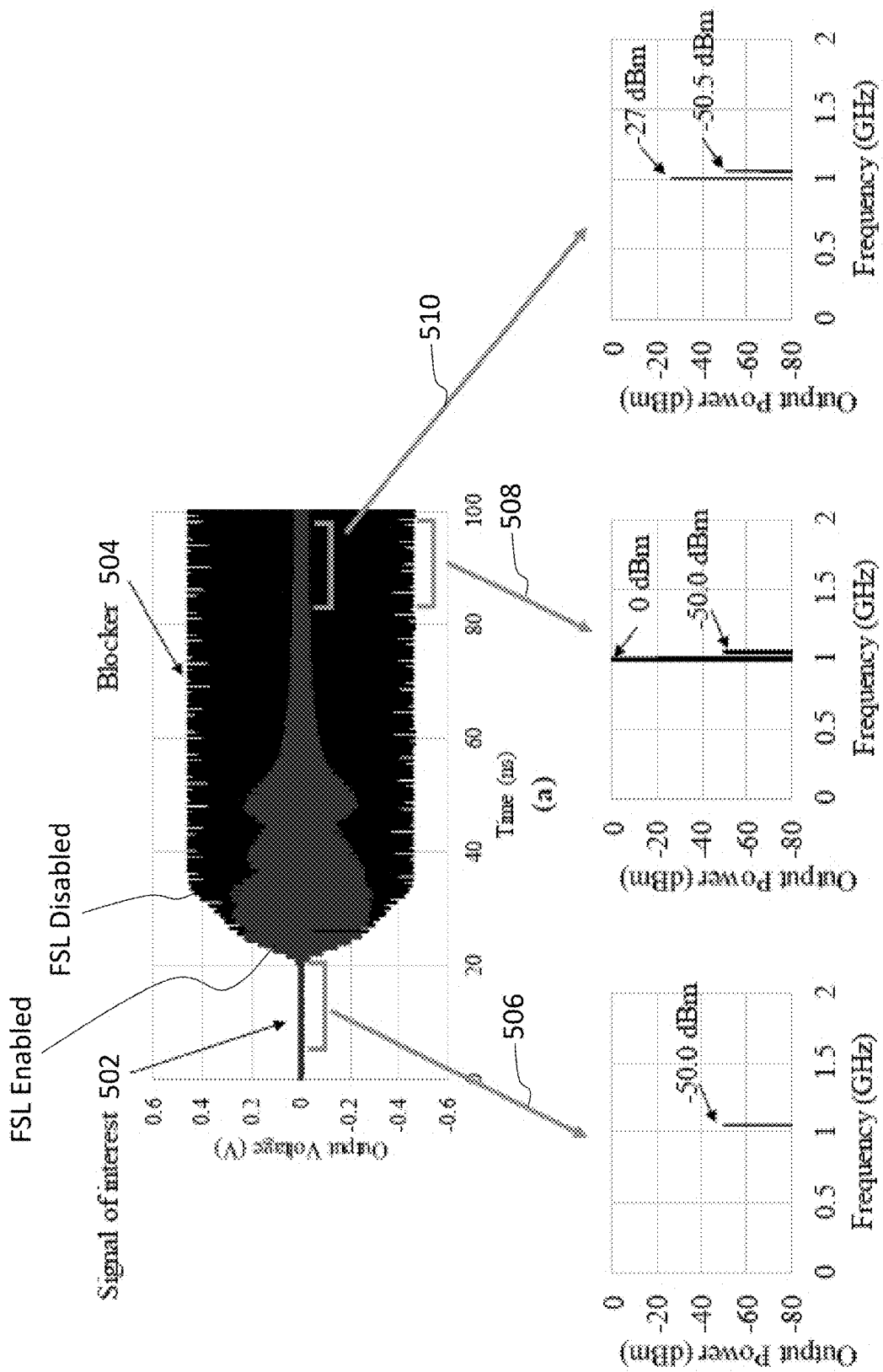
FIG. 5 provides simulated data of the self-tuning N-path filter of FIG. 2, in accordance with an embodiment of the present disclosure.

FIG. 5 provides simulated signal results showing the effect on an input RF signal with a jamming signal present when frequency-selective limiting (FSL) is not used and when it is used, in accordance with some of the embodiments of the present disclosure. A signal of interest 502 in this simulated example includes an amplitude of −50 dBm and a frequency of 1.05 GHz as shown in graph portion 506. As seen in the top graph, after about 20 ns, a large blocking (or jamming) signal 504 is applied. If no FSL is used, the jamming signal 504 shown in black overpowers the signal of interest with an amplitude of around 0 dBm and a close frequency of 1.00 GHz as seen in graph portion 508. Due to the frequency proximity and relatively large amplitude of jamming frequency 504 compared to signal of interest 502, it would be very difficult to recover signal of interest 502. However, when FSL is enabled, the jamming signal 504 shown in grey is greatly attenuated while attenuation to the signal of interest is far less as shown in graph portion 510 where the jamming signal 504 has had its amplitude reduced by 27 dBm while the amplitude of signal of interest 502 is only reduced by 0.5 dBm. The ability to recover signal of interest 502 is greatly improved the more that jamming signal 504 is attenuated.

According to some embodiments, each of the components illustrated in FIGS. 1 through 4, or FIGS. 3 and 4 (or some other degree of integration) may be incorporated into a package as a system-in-package (SIP). For example, at least conditioning circuit 204 and bandstop filter 206 may be monolithically integrated on a same semiconductor chip or provided on different semiconductor chips of the same material. In some embodiments, the semiconductor chip is implemented with gallium arsenide (GaAs) based processing, although other group III-V semiconductor materials such as gallium nitride (GaN) or indium gallium arsenide (InGaAs), and/or group IV semiconductor materials such as silicon or germanium or silicon germanium (SiGe), may be used to implement the various semiconductor chips of the example embodiments provided herein, as will be appreciated. Standard semiconductor processing and packaging can be used.

Figure 6:
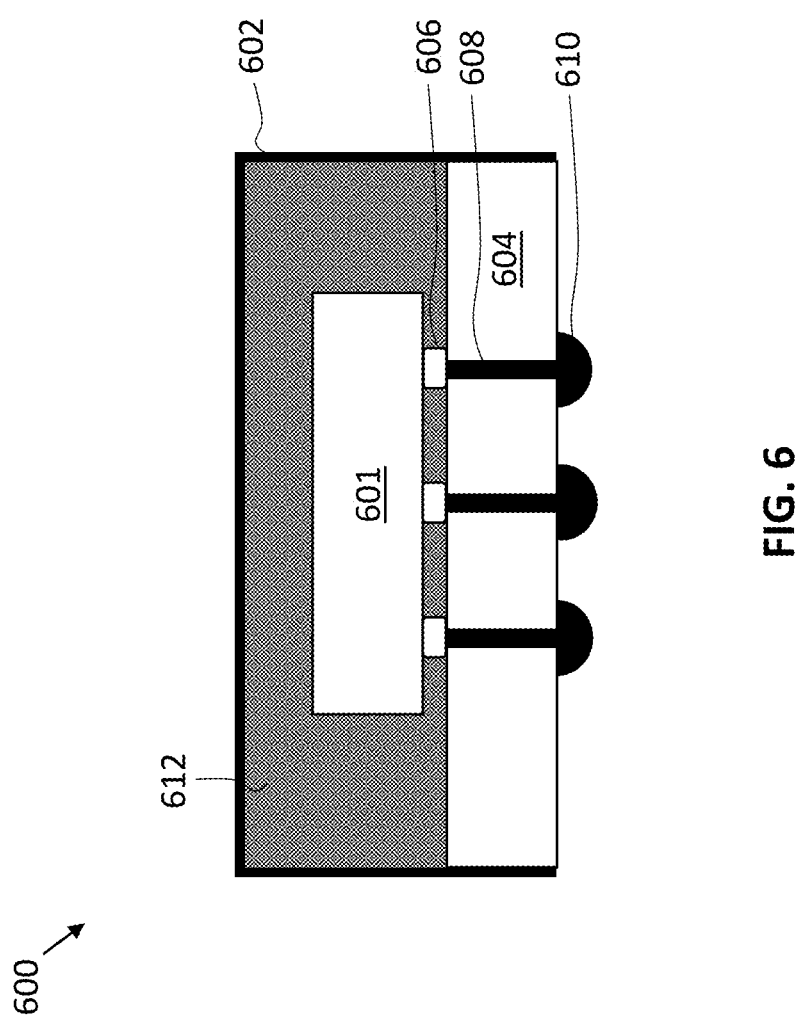
FIG. 6 illustrates a cross-section view of a chip package that includes at least the self-tuning N-path filter in FIG. 2, and possibly circuitry of the RF receiver system in FIG. 1, in accordance with an embodiment of the present disclosure.

FIG. 6 illustrates an example embodiment of a chip package 600. As can be seen, chip package 600 may be a SIP that includes an integrated circuit (IC) die 601. Other dies may be included as well within chip package 600 and coupled to the same package substrate 604. In some embodiments, IC die 601 includes at least conditioning circuit 204 and bandstop filter 206. As can be further seen, chip package 600 includes a housing 602 that is bonded to package substrate 604. Housing 602 may be any material that provides environmental protection for the components of chip package 600. IC die 601 may be conductively coupled to package substrate 604 using connections 606. In some embodiments, connections 606 represent any standard or proprietary connection mechanism, such as solder bumps, ball grid array (BGA), pins, or wire bonds, to name a few examples. Package substrate 604 may include a dielectric material having conductive pathways (e.g., including conductive vias and lines) extending through the dielectric material between the faces of package substrate 604, or between different locations on each face. For example, package substrate 604 may include multiple stacked layers of dielectric material with conductive traces running surfaces of one or more of the layers of dielectric material, and one or more conductive vias extending between any number of the layers of dielectric material. In some embodiments, package substrate 604 may have a thickness less than 1 millimeter (e.g., between 0.1 millimeters and 0.5 millimeters), although any number of package geometries can be used. Additional conductive contacts 610 may be disposed at an opposite face of package substrate 604 for conductively contacting, for instance, a printed circuit board or another chip package. One or more vias 608 extend through a thickness of package substrate 604 to provide conductive pathways between one or more of connections 606 to one or more of contacts 610. Vias 608 may be single straight columns (as illustrated), however, other configurations can be used (e.g., damascene, dual damascene, through-silicon via). In still other embodiments, vias 608 are fabricated by multiple smaller stacked vias, or are staggered at different locations across various ones of the stacked dielectric layers of package substrate 604. Contacts 610 may be solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 610, to inhibit shorting.

In some embodiments, a mold material 612 may be disposed around IC die 601 included within housing 602. In some embodiments, mold material 612 is included between IC die 601 and package substrate 604 as an underfill material, as well as between IC die 601 and housing 602 as an overfill material. The dimensions and qualities of mold material 612 can vary depending on the type of chip package used and the environment the package is used in. In some embodiments, a thickness of mold material 612 is less than 1 millimeter. Example materials that may be used for mold material 612 include epoxy mold materials. In some cases, mold material 612 is thermally conductive, in addition to being electrically insulating. In some embodiments, mold material 612 causes little to no attenuation of RF signals being received by, or transmitted from, IC die 601.

Example Communication Device

Figure 7:
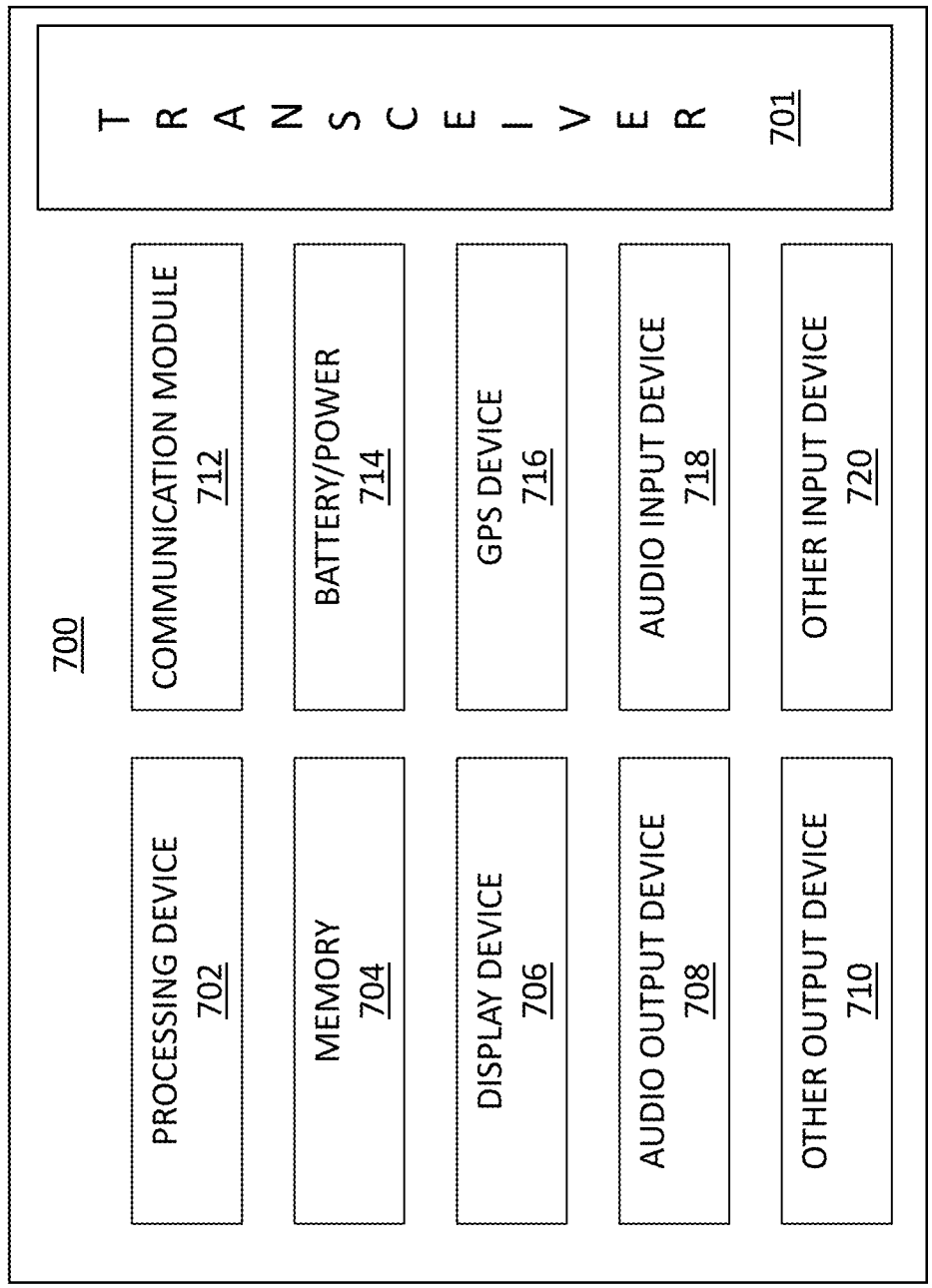
FIG. 7 illustrates a block diagram of an example communication device that may include a wideband transceiver, in accordance with an embodiment of the present disclosure.

FIG. 7 is a block diagram of an example communication device 700 that may include a wideband receiver, or transceiver, that includes an RF front end circuitry in accordance with any of the embodiments disclosed herein. For example, communication device 700 includes transceiver 701 having RF front end circuitry 104 for receiving wideband GHz-level signals. Other frequency bands may be used as well, depending on the application. According to some embodiments, the RF circuitry of transceiver 701 includes the portion of RF front end circuitry 104 designed to attenuate blocker or jamming signals using an N-path bandstop filter. In some embodiments, transceiver 701 is replaced with a receiver having RF front end circuitry 104, or other circuitry including N-path filer circuitry as variously provided herein. Several components are illustrated in FIG. 7 as included in the communication device 700, but any one or more of these components may be omitted or duplicated, as suitable for the application. In some embodiments, some or all of the components included in the communication device 700 may be attached to one or more motherboards. In some embodiments, some or all of these components are fabricated onto a single SIP.

Additionally, in various embodiments, communication device 700 may not include one or more of the components illustrated in FIG. 7, but communication device 700 may include interface circuitry for coupling to the one or more components. For example, communication device 700 may not include a display device 706, but may include display device interface circuitry (e.g., a connector and driver circuitry) to which display device 706 may be coupled. In another set of examples, communication device 700 may not include an audio input device 718 or an audio output device 708 but may include audio input or output device interface circuitry (e.g., connectors and supporting circuitry) to which audio input device 718 or audio output device 708 may be coupled.

Communication device 700 may include a processing device 702 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. Communication device 700 may include a memory 704, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 704 may include memory that shares a die with processing device 702. This memory may be used as cache memory and may include embedded dynamic random-access memory (eDRAM) or spin transfer torque magnetic random access memory (STT-MRAM).

In some embodiments, communication device 700 may include a communication module 712 (e.g., one or more communication modules). For example, communication module 712 may be configured for managing wireless communications for the transfer of data to and from communication device 700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication module 712 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication module 712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication module 712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication module 712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication module 712 may operate in accordance with other wireless protocols in other embodiments. Communication device 700 may include transceiver 701 to facilitate wireless communications and/or to receive other wireless communications (such as AM or FM radio transmissions).

In some embodiments, communication module 712 may manage wired communications, such as electrical, optical, or any other suitable communication protocols (e.g., the Ethernet). As noted above, communication module 712 may include multiple communication modules. For instance, a first communication module may be dedicated to shorter-range wireless communications such as Wi-Fi or Bluetooth, and a second communication module may be dedicated to longer-range wireless communications such as global positioning system (GPS), EDGE, GPRS, CDMA, WiMAX, LTE, EV-DO, or others. In some embodiments, the first communication module may be dedicated to wireless communications, and the second communication module may be dedicated to wired communications.

Communication device 700 may include battery/power circuitry 714. Battery/power circuitry 714 may include one or more energy storage devices (e.g., batteries or capacitors) and/or circuitry for coupling components of communication device 700 to an energy source separate from communication device 700 (e.g., AC line power).

Communication device 700 may include a display device 706 (or corresponding interface circuitry, as discussed above). Display device 706 may include any visual indicators, such as a heads-up display, a computer monitor, a projector, a touchscreen display, a liquid crystal display (LCD), a light-emitting diode display, or a flat panel display.

Communication device 700 may include an audio output device 708 (or corresponding interface circuitry, as discussed above). Audio output device 708 may include any device that generates an audible indicator, such as speakers, headsets, or earbuds.

Communication device 700 may include audio input device 718 (or corresponding interface circuitry, as discussed above). Audio input device 718 may include any device that generates a signal representative of a sound, such as microphones, microphone arrays, or digital instruments (e.g., instruments having a musical instrument digital interface (MIDI) output).

Communication device 700 may include a GPS device 716 (or corresponding interface circuitry, as discussed above). GPS device 716 may be in communication with a satellite-based system and may receive a location of communication device 700, as known in the art.

Communication device 700 may include an-other output device 710 (or corresponding interface circuitry, as discussed above). Examples of other output device 710 may include an audio codec, a video codec, a printer, a wired or wireless transmitter for providing information to other devices, or an additional storage device.

Communication device 700 may include an-other input device 720 (or corresponding interface circuitry, as discussed above). Examples of other input device 720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Communication device 700 may have any desired form factor, such as a handheld or mobile communication device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop communication device, a server or other networked computing component, a printer, a scanner, a monitor, a set-top box, an entertainment control unit, a vehicle control unit, a digital camera, a digital video recorder, or a wearable communication device. In some embodiments, the communication device 700 may be any other electronic device that processes data.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a radio frequency (RF) filter that includes a signal conditioning circuit and a bandstop filter. The signal conditioning circuit is configured to receive an RF signal, the RF signal including a jamming signal at a jamming frequency and a signal of interest. The signal conditioning circuit is further configured to generate a plurality of clock signals. Each of the plurality of clock signals has a frequency that is substantially the same as the jamming frequency, and each of the plurality of clock signals has a different phase shift. The bandstop filter is configured to receive the RF signal and the plurality of clock signals and to attenuate signals within a bandstop centered at the frequency of the plurality of clock signals. The jamming frequency is within the bandstop and the signal of interest is outside the bandstop.

Example 2 includes the subject matter of Example 1, wherein the RF signal has a bandwidth between 10 GHz and 20 GHz.

Example 3 includes the subject matter of Example 1 or 2, wherein the plurality of clock signals includes 3, 4, 6, or 8 clock signals.

Example 4 includes the subject matter of any one of Examples 1-3, wherein the bandstop filter is an N-path bandstop filter having one or more capacitors arranged along N switched paths.

Example 5 includes the subject matter of any one of Examples 1-4, wherein the signal conditioning circuit comprises a voltage limiter circuit configured to receive the RF signal and produce a square-wave signal having a frequency that is substantially the same as the jamming frequency.

Example 6 includes the subject matter of Example 5, wherein the signal conditioning circuit comprises a delay-locked loop (DLL) configured to receive the square-wave signal and generate the plurality of clock signals.

Example 7 includes the subject matter of Example 6, wherein the DLL comprises edge-combining circuitry configured to change a duty cycle of each of the plurality of clock signals based on the number of clock signals in the plurality of clock signals.

Example 8 includes the subject matter of Example 6 or 7, wherein the signal conditioning circuit comprises an envelope detector circuit configured to receive the RF signal and to provide an activation signal to the DLL if any portion of the RF signal has an amplitude higher than a threshold.

Example 9 includes the subject matter of Example 8, wherein the threshold is re-configurable.

Example 10 is a wideband RF receiver comprising the RF filter of any one of Examples 1-9.

Example 11 is a system-in-package (SIP) that includes a package substrate and one or more integrated circuit chips coupled to the package substrate. The one or more integrated circuit chips include a signal conditioning circuit and a bandstop filter. The signal conditioning circuit is configured to receive an RF signal, the RF signal including a jamming signal at a jamming frequency and a signal of interest. The signal conditioning circuit is further configured to generate a plurality of clock signals. Each of the plurality of clock signals has a frequency that is substantially the same as the jamming frequency, and each of the plurality of clock signals has a different phase shift. The bandstop filter is configured to receive the RF signal and the plurality of clock signals and to attenuate signals within a bandstop centered at the frequency of the plurality of clock signals. The jamming frequency is within the bandstop and the signal of interest is outside the bandstop.

Example 12 includes the subject matter of Example 11, wherein the RF signal has a bandwidth between 10 GHz and 20 GHz.

Example 13 includes the subject matter of Example 11 or 12, wherein the plurality of clock signals includes 3, 4, 6, or 8 clock signals.

Example 14 includes the subject matter of any one of Examples 11-13, wherein the bandstop filter is an N-path bandstop filter having one or more switched capacitors arranged along N switched paths.

Example 15 includes the subject matter of any one of Examples 11-14, wherein the signal conditioning circuit comprises a voltage limiter circuit configured to receive the RF signal and produce a square-wave signal having a frequency that is substantially the same as the jamming frequency.

Example 16 includes the subject matter of Example 15, wherein the signal conditioning circuit comprises a delay-locked loop (DLL) configured to receive the square-wave signal and generate the plurality of clock signals.

Example 17 includes the subject matter of Example 16, wherein the DLL comprises edge-combining circuitry configured to change a duty cycle of each of the plurality of clock signals based on the number of clock signals in the plurality of clock signals.

Example 18 includes the subject matter of Example 16 or 17, wherein the signal conditioning circuit comprises an envelope detector circuit configured to receive the RF signal and to provide an activation signal to the DLL if any portion of the RF signal has an amplitude higher than a threshold.

Example 19 includes the subject matter of Example 18, wherein the threshold is re-configurable.

Example 20 is a receiver system that includes an antenna, RF front-end circuitry, an analog-to-digital converter, and a digital signal processor. The antenna is configured to receive an RF signal having a jamming signal at a jamming frequency and a signal of interest. The RF front-end circuitry is configured to receive the RF signal from the antenna and to generate an amplified portion of the RF signal. The analog-to-digital converter is configured to receive the amplified portion of the RF signal and to generate a digitized signal. The digital signal processor is configured to receive the digitized signal. The RF front-end circuitry further includes a signal conditioning circuit and a bandstop filter.

The signal conditioning circuit is configured to receive the RF signal. The signal conditioning circuit is further configured to generate a plurality of clock signals. Each of the plurality of clock signals has a frequency that is substantially the same as the jamming frequency, and each of the plurality of clock signals has a different phase shift. The bandstop filter is configured to receive the RF signal and the plurality of clock signals and to attenuate signals within a bandstop centered at the frequency of the plurality of clock signals. The jamming frequency is within the bandstop and the signal of interest is outside the bandstop.

Example 21 includes the subject matter of Example 20, wherein the RF signal has a bandwidth between 10 GHz and 20 GHz.

Example 22 includes the subject matter of Example 20 or 21, wherein the plurality of clock signals includes 3, 4, 6, or 8 clock signals.

Example 23 includes the subject matter of any one of Examples 20-22, wherein the bandstop filter is an N-path bandstop filter having one or more switched capacitors arranged along N switched paths.

Example 24 includes the subject matter of any one of Examples 20-23, wherein the signal conditioning circuit comprises a voltage limiter circuit configured to receive the RF signal and produce a square-wave signal having a frequency that is substantially the same as the jamming frequency.

Example 25 includes the subject matter of Example 24, wherein the signal conditioning circuit comprises a delay-locked loop (DLL) configured to receive the square-wave signal and generate the plurality of clock signals.

Example 26 includes the subject matter of Example 25, wherein the DLL comprises edge-combining circuitry configured to change a duty cycle of each of the plurality of clock signals based on the number of clock signals in the plurality of clock signals.

Example 27 includes the subject matter of Example 25 or 26, wherein the signal conditioning circuit comprises an envelope detector circuit configured to receive the RF signal and to provide an activation signal to the DLL if any portion of the RF signal has an amplitude higher than a threshold.

Example 28 includes the subject matter of Example 27, wherein the threshold is re-configurable.

Example 29 includes the subject matter of any of the previous Examples, wherein the receiver, SIP, or RF filter is part of a transceiver system.

What is claimed is:

1. A radio frequency (RF) filter, comprising:
   a signal conditioning circuit configured to receive an RF signal, the RF signal including a jamming signal at a jamming frequency and a signal of interest, the signal conditioning circuit further configured to sense the jamming frequency and generate a plurality of clock signals, wherein each of the plurality of clock signals has a frequency that is substantially the same as the jamming frequency, and wherein each of the plurality of clock signals has a different phase shift; and
   an N-path bandstop filter configured to receive the RF signal and the plurality of clock signals and to attenuate signals within a bandstop centered at the frequency of the plurality of clock signals, wherein the N-path bandstop filter attenuates the jamming signal while passing signals at other frequencies, wherein the jamming frequency is within the bandstop and the signal of interest is outside the bandstop.

2. The RF filter of claim 1, wherein the RF signal has a bandwidth between 10 GHz and 20 GHz.

3. The RF filter of claim 1, wherein the plurality of clock signals includes 3, 4, 6, or 8 clock signals.

4. The RF filter of claim 1, wherein the N-path bandstop filter includes one or more capacitors arranged along N switched paths.

5. The RF filter of claim 1, wherein the signal conditioning circuit comprises a voltage limiter circuit configured to receive the RF signal and produce a square-wave signal having a frequency that is substantially the same as the jamming frequency.

6. The RF filter of claim 5, wherein the signal conditioning circuit comprises a delay-locked loop (DLL) configured to receive the square-wave signal and generate the plurality of clock signals.

7. The RF filter of claim 6, wherein the signal conditioning circuit comprises edge-combining circuitry configured to change a duty cycle of each of the plurality of clock signals based on the number of clock signals in the plurality of clock signals.

8. The RF filter of claim 6, wherein the signal conditioning circuit comprises an envelope detector circuit configured to receive the RF signal and to provide an activation signal to the DLL if any portion of the RF signal has an amplitude higher than a threshold.

9. The RF filter of claim 8, wherein the threshold is re-configurable.

10. The RF filter of claim 1, wherein a frequency of the signal of interest is unknown.

11. The RF filter of claim 1, wherein the N-path bandstop filter autonomously implements a bandstop transfer function centered on the jammer frequency.

12. A wideband RF receiver comprising the RF filter of claim 1.

13. A system-in-package (SIP) device, comprising:
a package substrate; and
one or more integrated circuit chips coupled to the package substrate and comprising a signal conditioning circuit configured to receive an RF signal, the RF signal including a jamming signal at a jamming frequency and a signal of interest, the signal conditioning circuit further configured to generate a plurality of clock signals, wherein each of the plurality of clock signals has a frequency that is substantially the same as the jamming frequency, and wherein each of the plurality of clock signals has a different phase shift; and
an N-path bandstop filter configured to receive the RF signal and the plurality of clock signals and to attenuate signals within a bandstop centered at the frequency of the plurality of clock signals, wherein the N-path bandstop filter attenuates the jamming signal while passing signals at other frequencies wherein the jamming frequency is within the bandstop and the signal of interest is outside the bandstop.

14. The SIP device of claim 13, wherein the N-path bandstop filter includes one or more switched capacitors arranged along N switched paths.

15. The SIP device of claim 13, wherein the signal conditioning circuit comprises a voltage limiter circuit configured to receive the RF signal and produce a square-wave signal having a frequency that is substantially the same as the jamming frequency.

16. The SIP device of claim 15, wherein the signal conditioning circuit comprises a delay-locked loop (DLL) configured to receive the square-wave signal and generate the plurality of clock signals.

17. The SIP device of claim 16, wherein the DLL comprises an edge-combining circuit configured to change a duty cycle of each of the plurality of clock signals based on the number of clock signals in the plurality of clock signals.

18. The SIP device of claim 16, wherein the signal conditioning circuit comprises an envelope detector circuit configured to receive the RF signal and to provide an activation signal to the DLL if any portion of the RF signal has an amplitude higher than a threshold.

19. The SIP device of claim 18, wherein the threshold is re-configurable.

20. A receiver system, comprising:
an antenna configured to receive an RF signal having a jamming signal at a jamming frequency and a signal of interest;
RF front-end circuitry configured to receive the RF signal from the antenna and to generate an amplified portion of the RF signal;
an analog-to-digital converter configured to receive the amplified portion of the RF signal and to generate a digitized signal; and
a digital signal processor configured to receive the digitized signal,
wherein the RF front-end circuitry comprises:
a signal conditioning circuit configured to receive the RF signal and generate a plurality of clock signals, wherein each of the plurality of clock signals has a frequency that is substantially the same as the jamming frequency, and wherein each of the plurality of clock signals has a different phase shift; and
a tunable N-path bandstop filter configured to receive the RF signal and the plurality of clock signals and to attenuate signals within a bandstop centered at the frequency of the plurality of clock signals, wherein the N-path bandstop filter attenuates the jamming signal while passing signals at other frequencies, wherein the jamming frequency is within the bandstop and the signal of interest is outside the bandstop.

* * * * *